United States Patent [19]
Hamamoto et al.

[11] Patent Number: 5,387,532
[45] Date of Patent: Feb. 7, 1995

[54] SEMICONDUCTOR MEMORY HAVING CAPACITOR ELECTRODE FORMED ABOVE BIT LINE

[75] Inventors: Takeshi Hamamoto, Kawasaki; Fumio Horiguchi, Tokyo; Katsuhiko Hieda, Yokohama, all of Japan

[73] Assignee: Kabushiki Kaisha Toshiba, Kawasaki, Japan

[21] Appl. No.: 103,663

[22] Filed: Aug. 10, 1993

Related U.S. Application Data

[60] Division of Ser. No. 831,657, Feb. 7, 1992, Pat. No. 5,234,199, which is a continuation of Ser. No. 328,374, Mar. 24, 1989, abandoned.

[30] Foreign Application Priority Data

Mar. 25, 1988 [JP] Japan ................. 63-069626

[51] Int. Cl.$^6$ ............. H01L 21/70; H01L 27/00
[52] U.S. Cl. .................... 437/52; 437/60; 437/919
[58] Field of Search ............ 437/47, 52, 60, 919

[56] References Cited

U.S. PATENT DOCUMENTS 4,816,423  3/1989  Havemann ............... 437/34
4,970,564  11/1990  Kimura et al. ............. 257/306
5,055,420  10/1991  Ikeda et al. .............. 437/34

OTHER PUBLICATIONS

Kinney et al., "A Non-Volatile Memory Cell Based on Ferroelectric Storage Capacitors", IEDM (1987), pp. 850–851.

Primary Examiner—Olik Chaudhuri
Assistant Examiner—H-Jey Tsai
Attorney, Agent, or Firm—Foley & Lardner

[57] ABSTRACT

A semiconductor memory has many memory cells of which each has a transistor and a capacitor. In each memory cell, one of source and drain regions of the transistor is connected to a bit line formed above the transistor. The capacitor includes a first capacitor electrode formed on a substrate and a second capacitor electrode formed on an insulation film coated on the surface of the first capacitor electrode. The first capacitor electrode is connected to the other of the source and drain regions of the transistor. The first capacitor electrode is formed above the bit line.

To manufacture such a semiconductor memory, each memory cell region is separately formed on the surface of a substrate. A gate insulation film is formed on the memory cell region. A gate electrode is formed on the gate insulation film. The gate electrode is used as a mask to dope the substrate with impurities to form source and drain regions of a transistor. A bit line is formed and connected to one of the source and drain regions. A first capacitor electrode is formed above the bit line and connected to the other of the source and drain regions. An insulation film is formed on the surface of the first capacitor electrode, and a second capacitor electrode is formed on the insulation film.

10 Claims, 13 Drawing Sheets

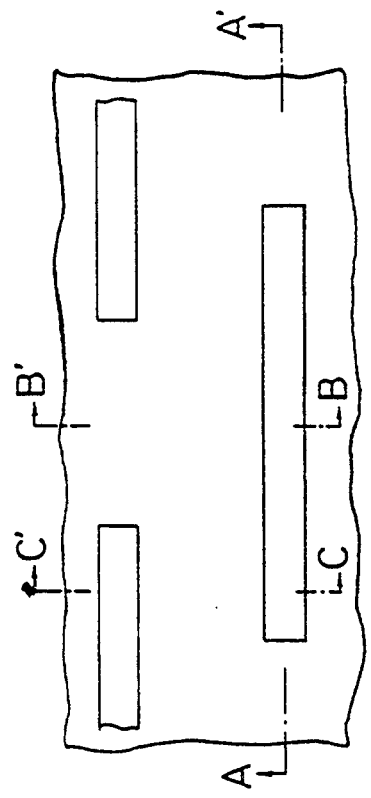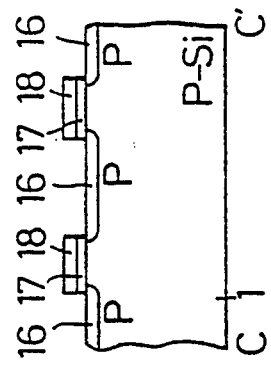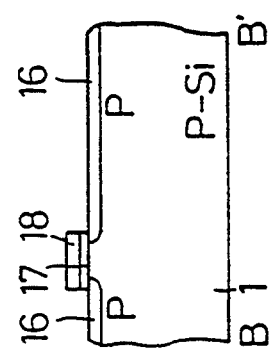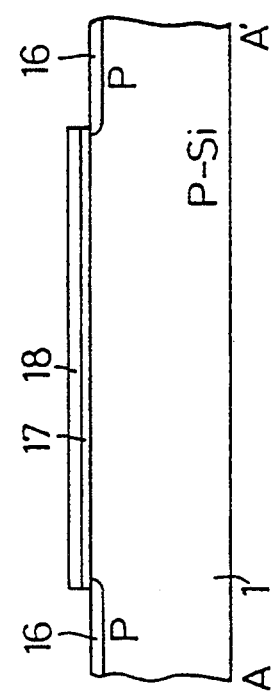

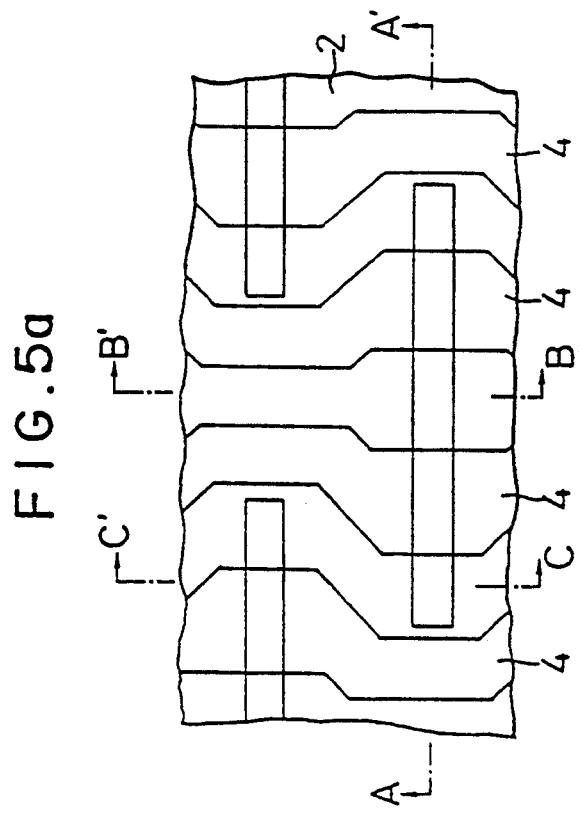
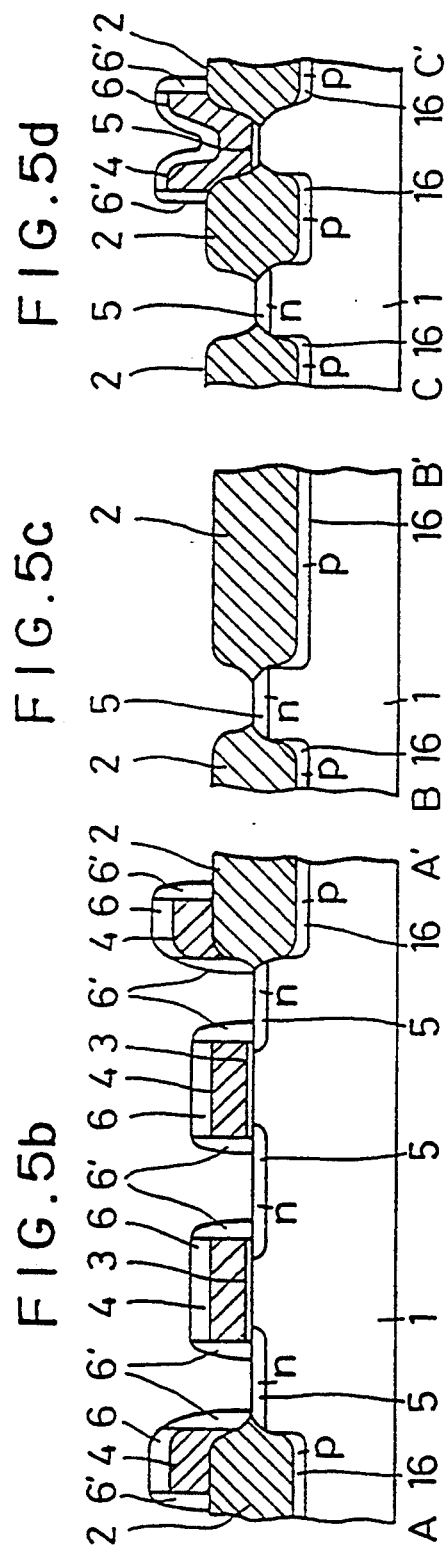

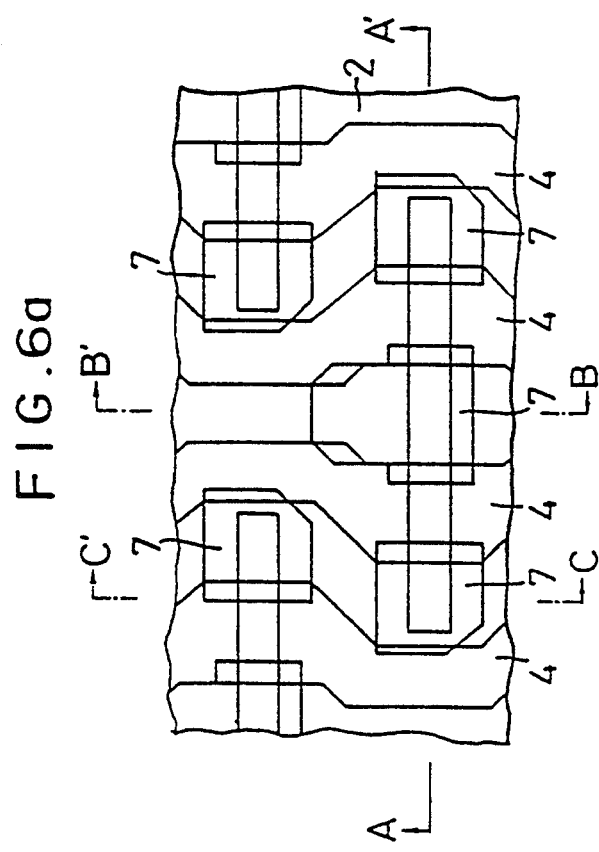
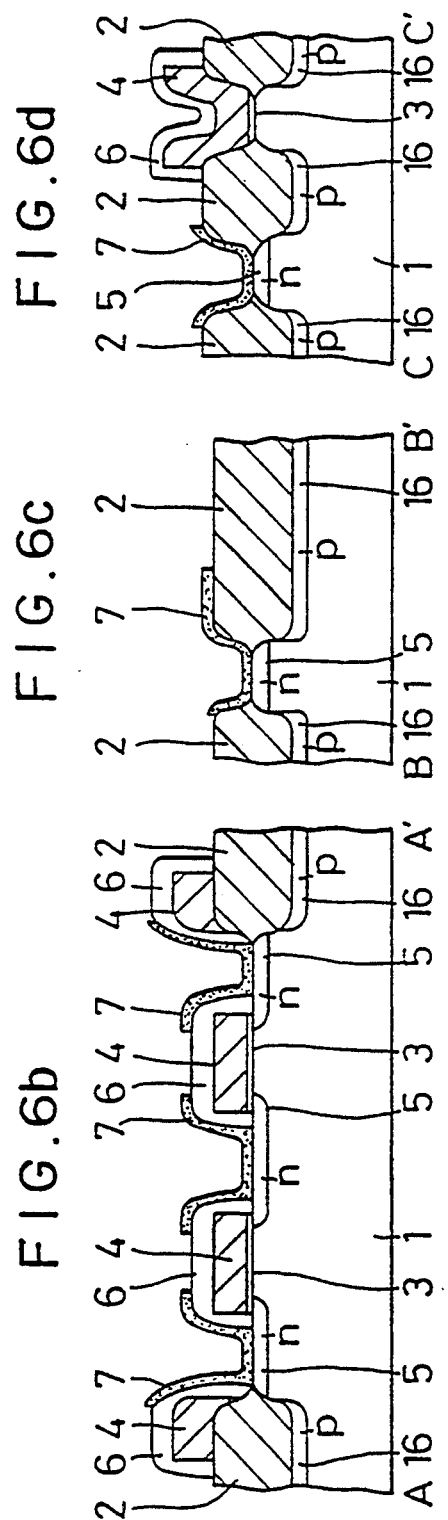

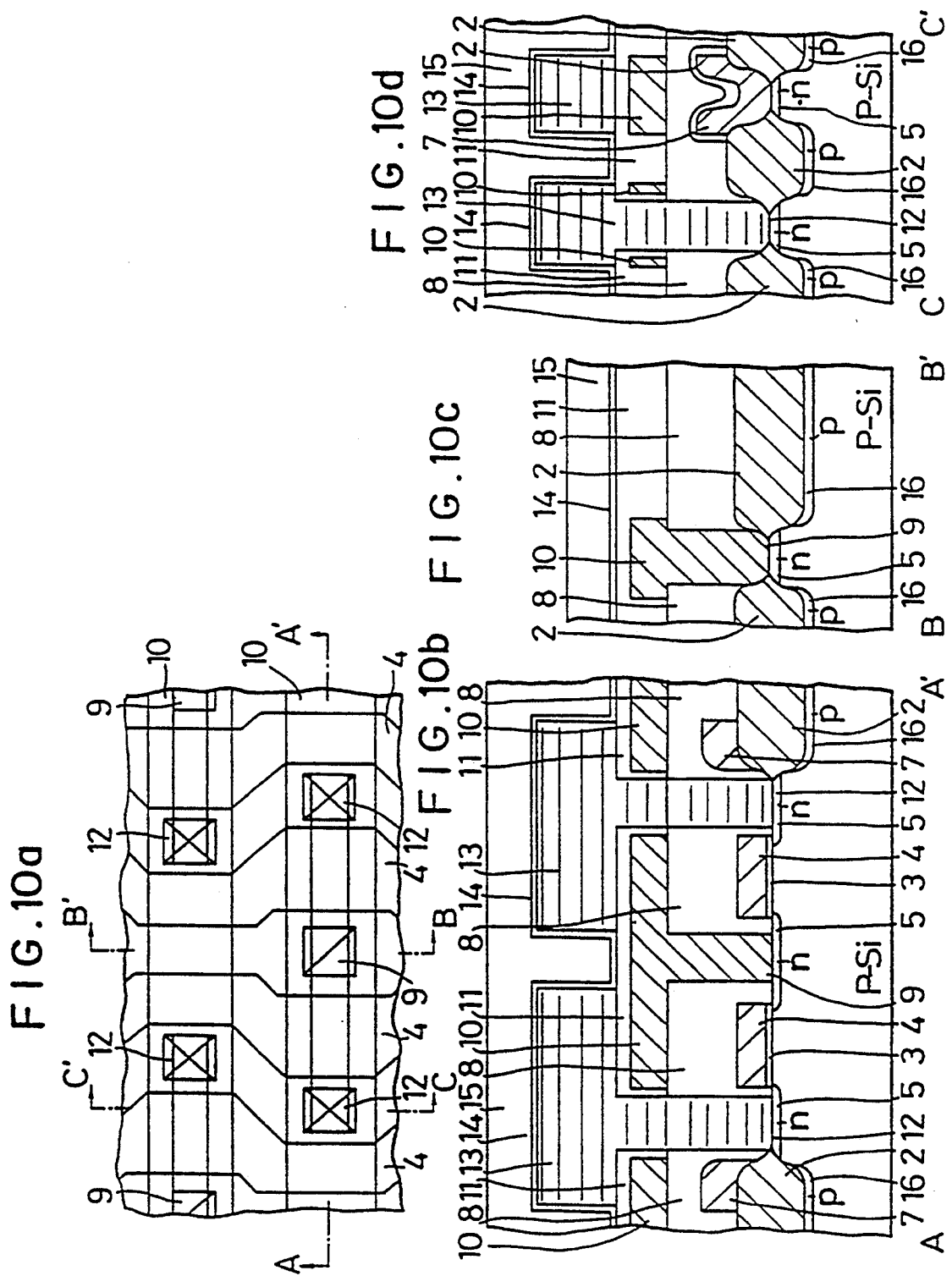

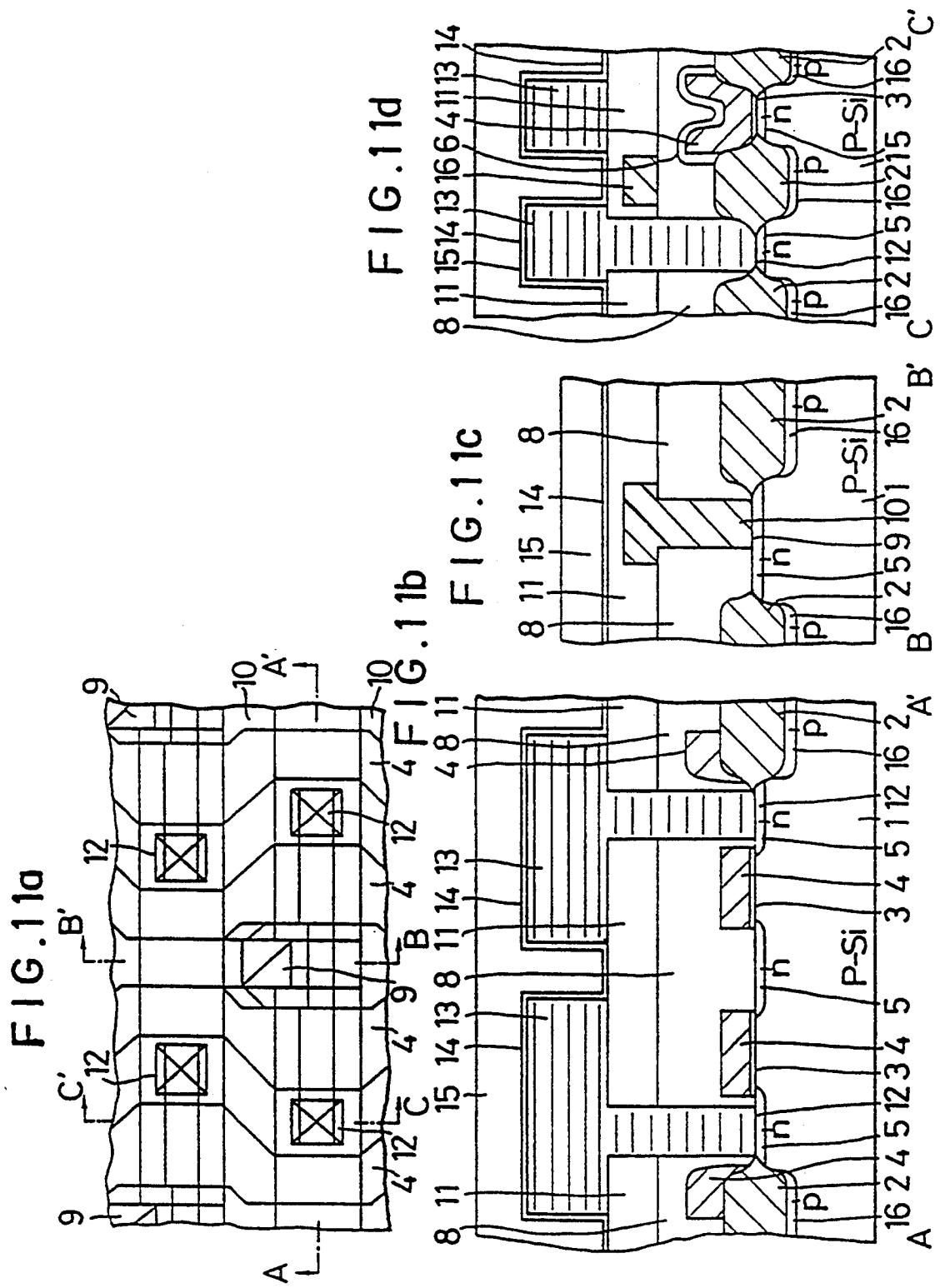

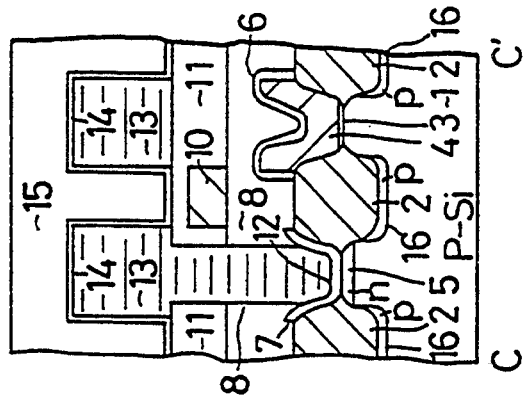
FIG.12a
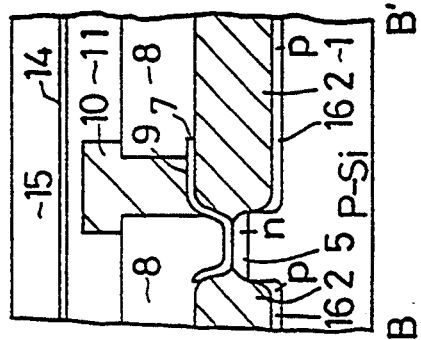
FIG.12c
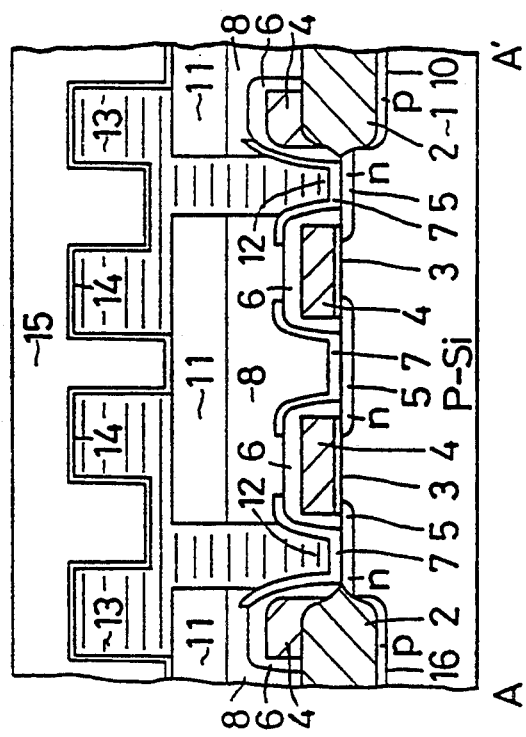
FIG.12b
FIG.12d

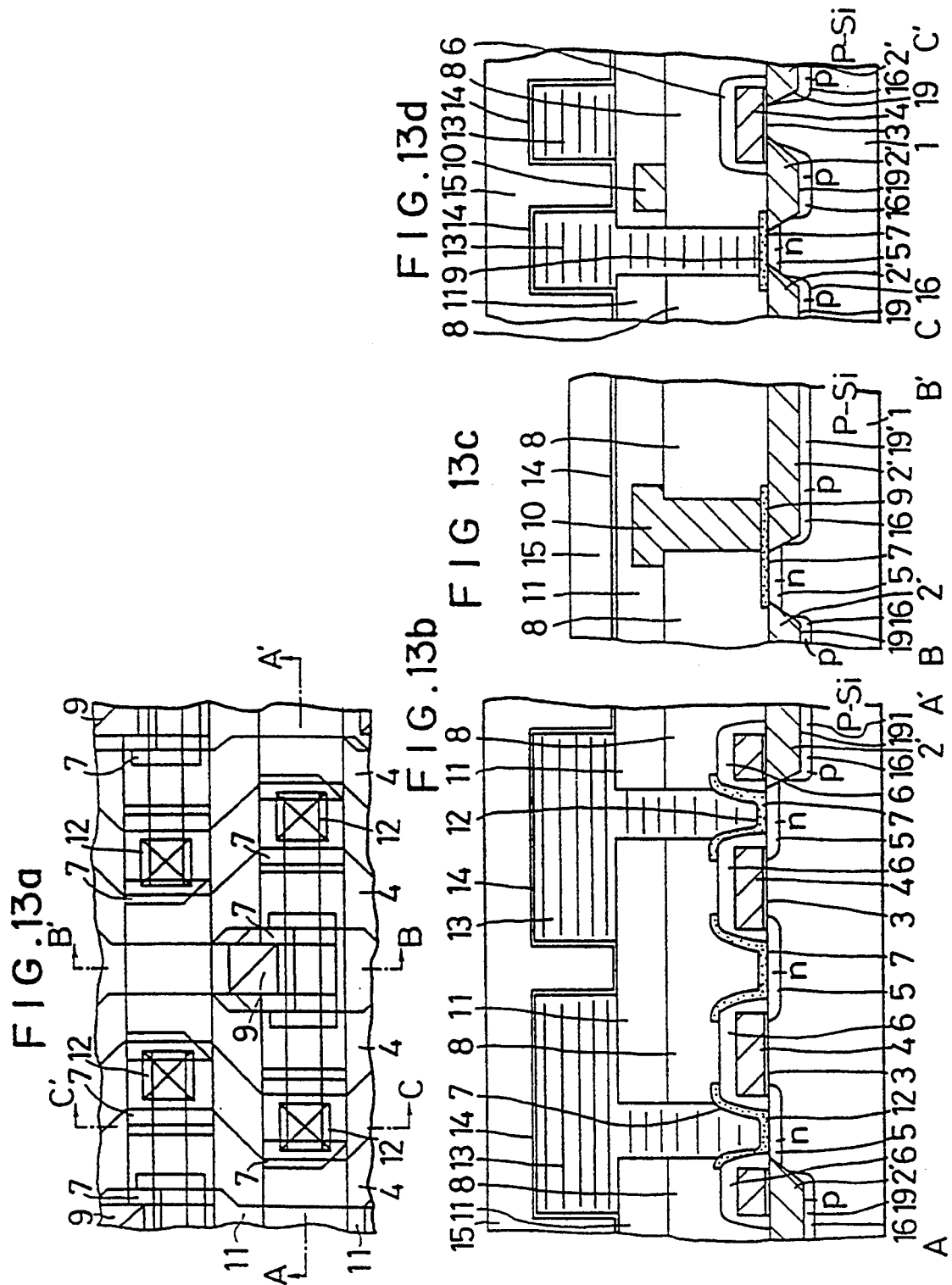

SEMICONDUCTOR MEMORY HAVING CAPACITOR ELECTRODE FORMED ABOVE BIT LINE

This application is a divisional of application Ser. No. 07/831,657,filed Feb. 7, 1992, now U.S. Pat. No. 5,234,199, which is a continuation of application Ser. No. 07/328,374, filed Mar. 24, 1989, now abandoned.

BACKGROUND OF THE INVENTION

1. Field of the Invention

The present invention relates to semiconductor memories and, particularly, to dynamic random access memories (DRAMs) with a cell structure including easily processed bit lines and a method of manufacturing such cell structure.

2. Description of the Prior Art

A metal-oxide semiconductor (MOS) type DRAM comprises memory cells, each including a MOS transistor and a capacitor. As the integration of DRAMs improves, the area of each capacitor of the DRAM will shrink that reduce amount of charges stored in the capacitor. This may cause errors (soft errors) that destroy memory contents.

To solve this problem, there has been proposed a method of forming storage nodes with polycrystalline silicon, etc., on a silicon substrate to expand the occupying area of each capacitor and increase capacitance, i.e., amount of charges to be stored in the capacitor.

This sort of DRAM is shown in FIGS. 1a to 1c, in which FIG. 1a is a plan view, FIG. 1b a sectional view taken along a line A—A' of FIG. 1a, and FIG. 1c a sectional view taken along a line B—B' of FIG. 1. The figures show cells of the DRAM corresponding to adjacent two bits.

In the figures, a numeral 101 is a p-type silicon substrate, and 105 an element separating insulation film. A storage node electrode 113 is made of, for instance, polycrystalline silicon. The storage node electrode 113 contacts the silicon substrate 101 through a storage node contact 112. The surface of the storage node electrode 113 is coated with a capacitor insulation film 114 on which a plate electrode 115 is deposited to form a MOS capacitor. Adjacent to the capacitor region, a MOS transistor is formed. Namely, a gate insulation film 109 is formed on silicon substrate 101, and a gate electrode 110 is formed on the gate insulation film 109. With the gate electrode as a mask, impurity ions are implanted in the silicon substrate 101 to form n-type layers 107 which will be source and drain of the MOS transistor. The MOS capacitor and MOS transistor thus formed constitute a cell which is called a stacked capacitor cell.

In the stacked capacitor cell, the storage node electrode 113 extends over the element separating insulation film 105, and a stepped portion 113' of the storage node electrode 113 contributes to increased capacitance.

With this arrangement, the capacitance is several times larger than that of a planar structure DRAM. Accordingly, a memory cell occupying area of the capacitor may be reduced with no reduction in the amount of charges to be stored in the capacitor. Moreover, a diffusion layer existing at a storage node portion to collect charges generated by alpha rays is only the diffusion layer 107 located under the storage node electrode 113. Namely, the diffusion layer which may collect the charges is remarkably small, thus providing a soft-error-resistive cell structure.

However, this cell structure has some drawbacks. Since the cell structure is not planar, it is hard to process. The number of electrodes of each stacked capacitor cell is larger by one than that of a planar capacitor cell because the stacked capacitor cell stores charges at the storage node electrode 113 while the planar capacitor cell stores the charges on a silicon substrate. In the stacked capacitor cell, the upper most layer is poorest in flatness. Therefore, the stacked capacitor cell is difficult to process with photolithography and etching techniques, and this difficulty may cause many open circuit and short-circuit defects.

Stepped portions are formed between the storage node electrode 113, capacitor insulation film 114 and plate electrode 115 so that the upper surface of an interlayer film 116 is widely separated from the substrate 101. This makes processing a bit line 118 difficult, and adversely affects on the coating characteristics of metal of the bit line 118.

To improve integration of the DRAM, an area of the storage node electrode 113 is reduced. Then, to maintain a fixed capacitance of the capacitor, the thickness of the storage node electrode 113 shall be increased to increase a ratio of capacitance provided by the stepped portion 113'. This may further degrade the flatness of the cell structure.

To connect the bit line 118 with the substrate 101 through a bit line contact 107, the plate electrode 115 shall be processed within a limited space between an edge of the storage node electrode 113 and the bit line contact 117. Namely, the dimensional allowance for this process is small to adversely affect integration. In addition, it is difficult to process the plate electrode 115 due to the large stepped portions formed by lower layers.

Further, the conventional stacked capacitor cell structure needs many heat treatment processes after formation of the capacitor insulation film 114. If the capacitor insulation film 114 is formed of high dielectric materials, the heat treatments may adversely influence the capacitor insulation film 114.

As described in the above, DRAMs employing the conventional stacked capacitor cell structure are poor in flatness, difficult to process and incapable of integration.

SUMMARY OF THE INVENTION

To solve the problems mentioned in the above, an object of the present invention is to provide a semiconductor memory whose bit lines are easy to process and a method of manufacturing such a semiconductor memory.

Another object of the present invention is to provide a semiconductor memory with increased capacitance and a method of manufacturing such a semiconductor memory.

Still another object of the present invention is to provide a stacked capacitor cell structure with a reduced number of heat treatment processes to be carried out after the formation of a capacitor insulation film, and a method of manufacturing such a capacitor cell structure.

In each memory cell of a semiconductor memory according to the present invention, one of the source and drain diffusion layers of a MOS transistor is connected to a bit line for removing charges. The bit line is formed above the MOS transistor. A capacitor of the memory cell comprises a first capacitor electrode formed on a semiconductor substrate, and a second capacitor electrode formed on an insulation film coated on the surface of the first capacitor electrode. The first capacitor electrode is connected to the other of the source and drain diffusion layers of the MOS transistor which is not connected to the bit line. The first capacitor electrode is formed above the bit line.

To manufacture the above-mentioned memory cell structure, a method of the present invention forms each separate memory cell region on the surface of a substrate, a gate insulation film on the memory cell region, and a gate electrode on the gate insulation film. The gate electrode is used as a mask to dope the substrate with impurities to form source and drain diffusion layers. A bit line is formed and connected to one of the source and drain diffusion layers. A first capacitor electrode is disposed above the bit line and connected to the other of the source and drain diffusion layers which is not connected to the bit line. An insulation film is formed on the surface of the first capacitor electrode, and a second capacitor electrode is formed on the insulation film.

With this memory cell structure, a lower wiring layer which exists when the bit line is to be formed is only the gate electrode. Therefore, with excellent flatness, the bit line is processed. There is no need to open the second capacitor electrode to provide a bit line contact. As a result, the thickness of the first capacitor electrode may be increased with no adverse effects on the processes of forming the bit line and second capacitor electrode.

In this way, the memory cell structure of the present invention can solve the problems such as poor flatness and difficult manufacturing processes of the conventional stacked capacitor cell structure.

These and other objects, features and advantages of the present invention will be more apparent from the following detailed description of preferred embodiments in conjunction with the accompanying drawings.

BRIEF DESCRIPTION OF THE DRAWINGS

FIG. 1b is a sectional view taken along a line A—A' of FIG. 1a;

FIG. 1c is a sectional view taken along a line B—B' of FIG. 1a;

FIG. 2b is a sectional view taken along a line A—A' FIG. 2a;

FIG. 2c is a sectional view taken along a line B—B' of FIG. 2a;

FIG. 2d is a sectional view taken along a line C—C' of FIG. 2a;

FIGS. 3a–3d, 4a–4d, 5a–5d, 6a–6d, 7a–7d, 8a–8d, 9a–9d are views showing manufacturing processes, respectively, of the DRAM of FIGS. 2a to 2d;

FIGS. 10a–10d are a view showing a DRAM according to a second embodiment of the present invention;

FIGS. 11a–11d are a view showing a DRAM according to a third embodiment of the present invention;

FIGS. 12a–12d are a view showing a DRAM according to a fourth embodiment of the present invention; and FIGS. 13a–13d are a view showing a DRAM according to a fifth embodiment of the present invention.

DETAILED DESCRIPTION OF THE EMBODIMENTS

Figure 1C:
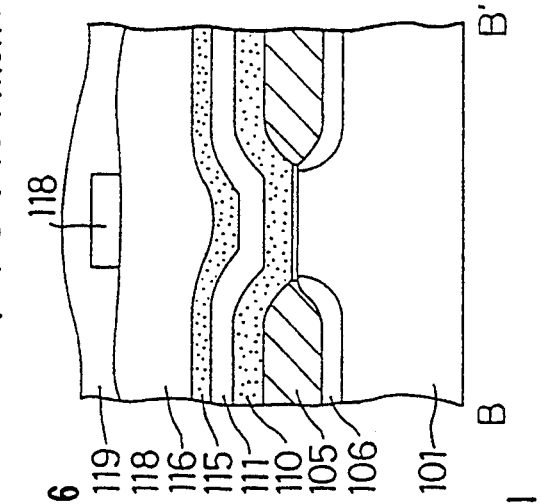
Figure 1A:
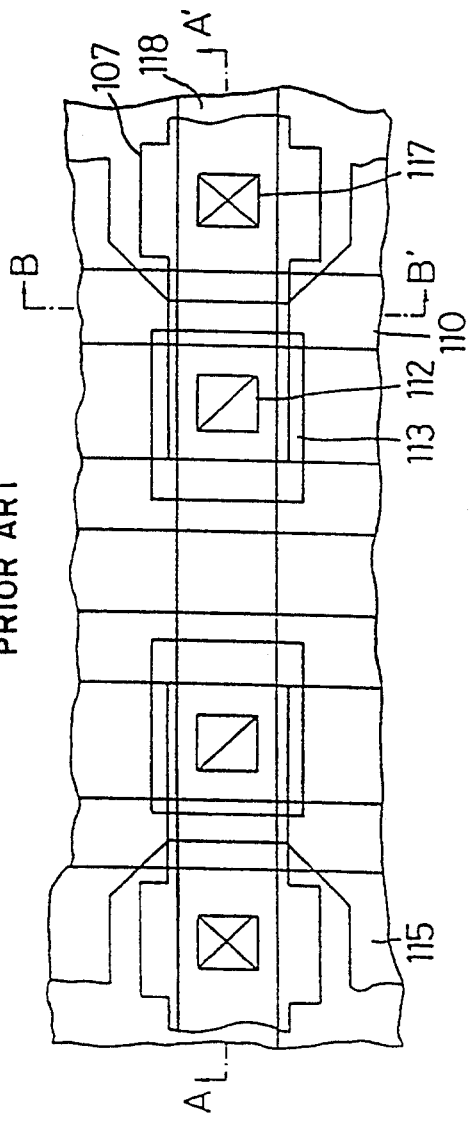
FIG. 1a is a plan view showing a conventional DRAM.
Figure 1B:
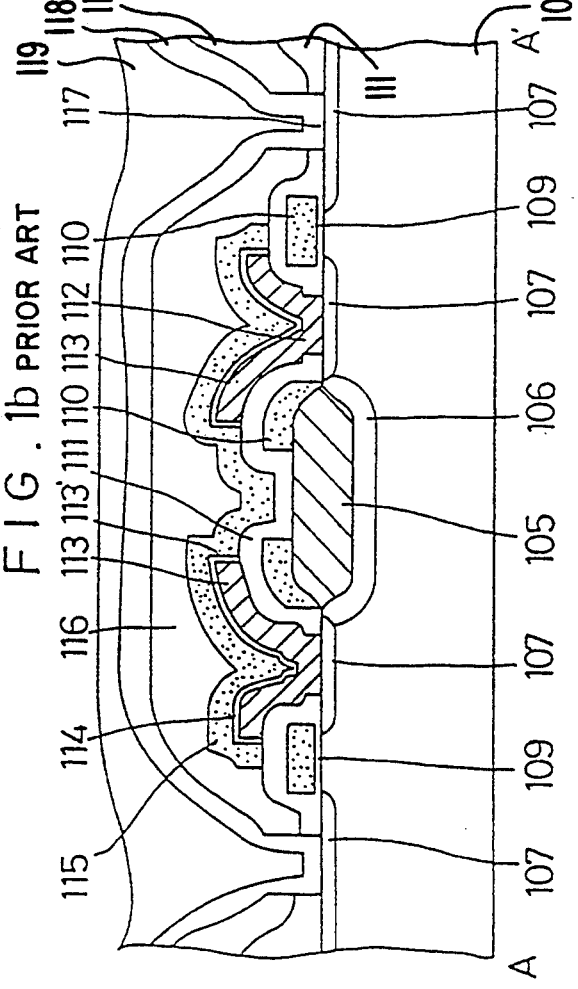
Figure 2D:
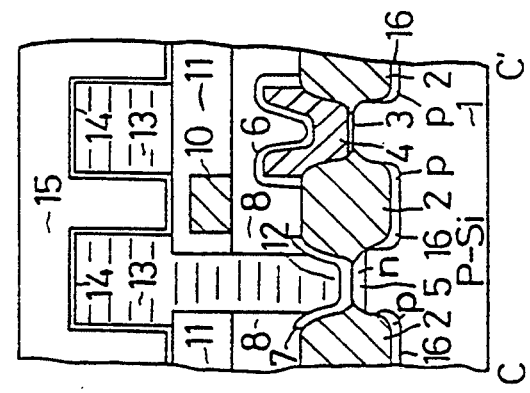
Figure 2C:
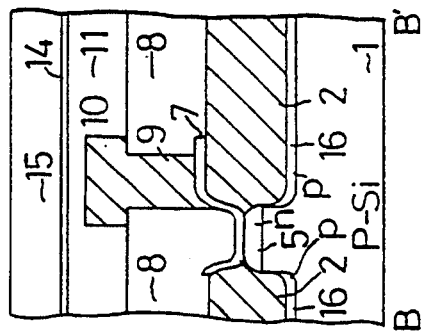
Figure 2A:
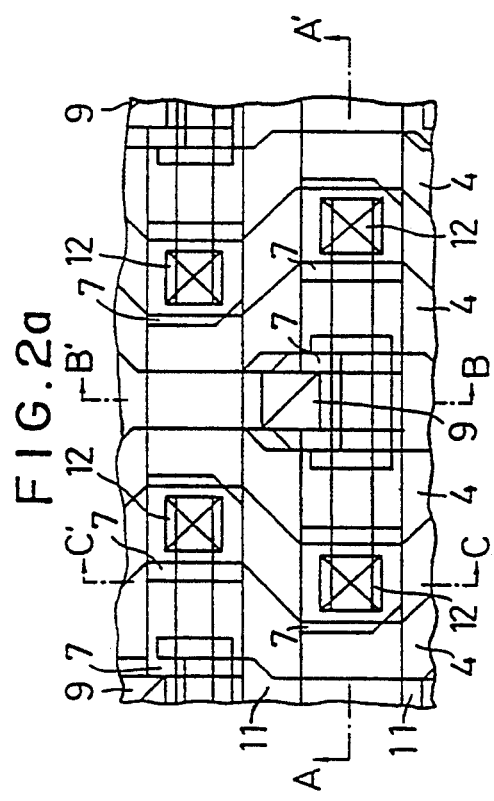
FIG. 2a is a plan view showing a DRAM according no a first embodiment of the present invention.
Figure 2B:
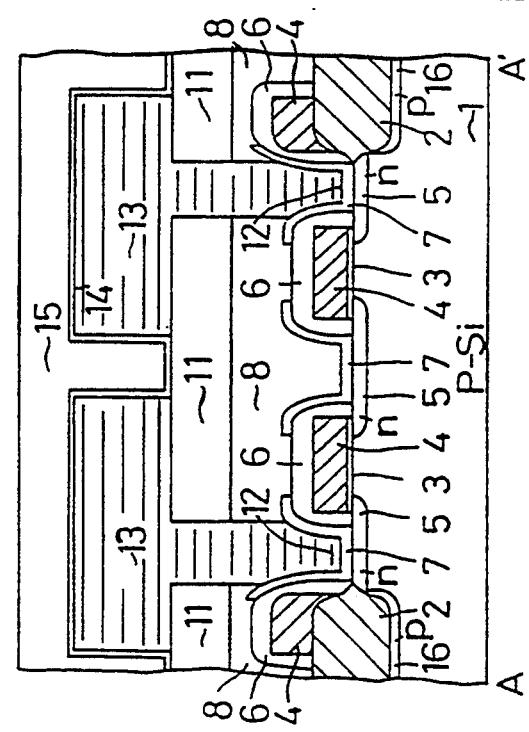
Figure 4A:
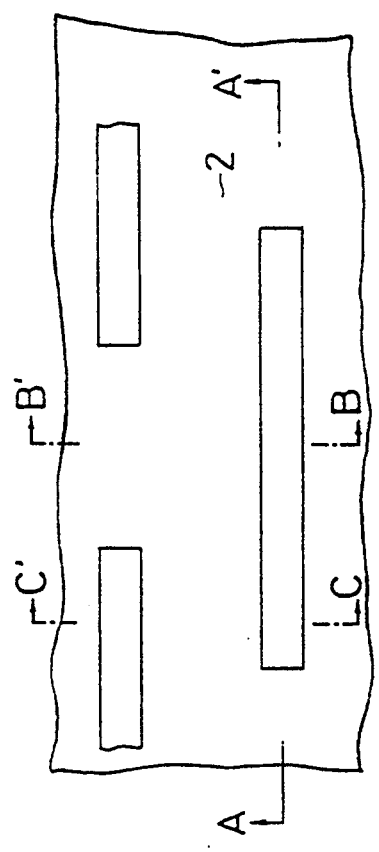
Figure 4D:
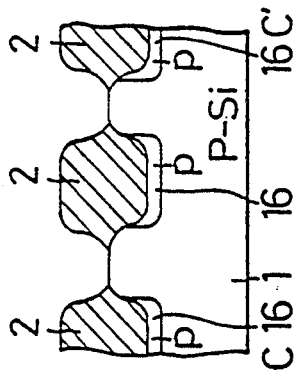
Figure 4C:
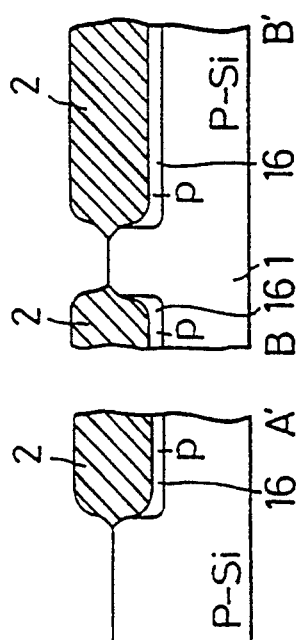
Figure 4B:
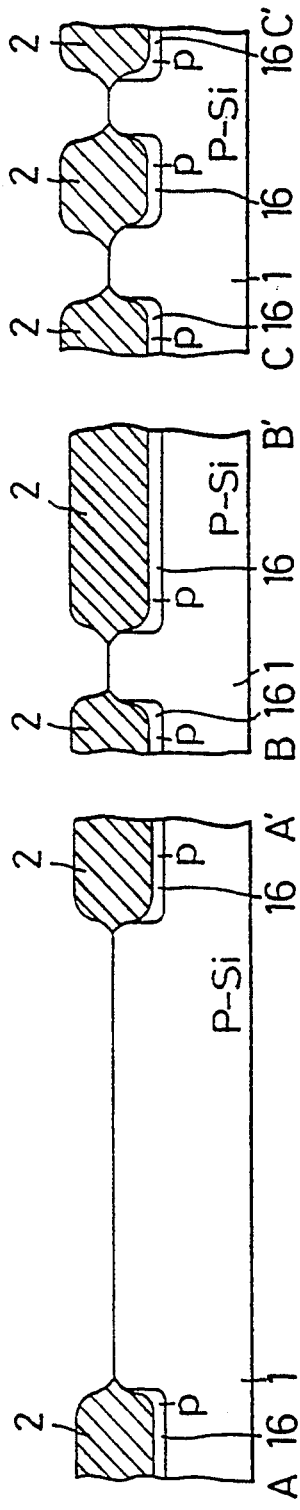
Figure 7A:
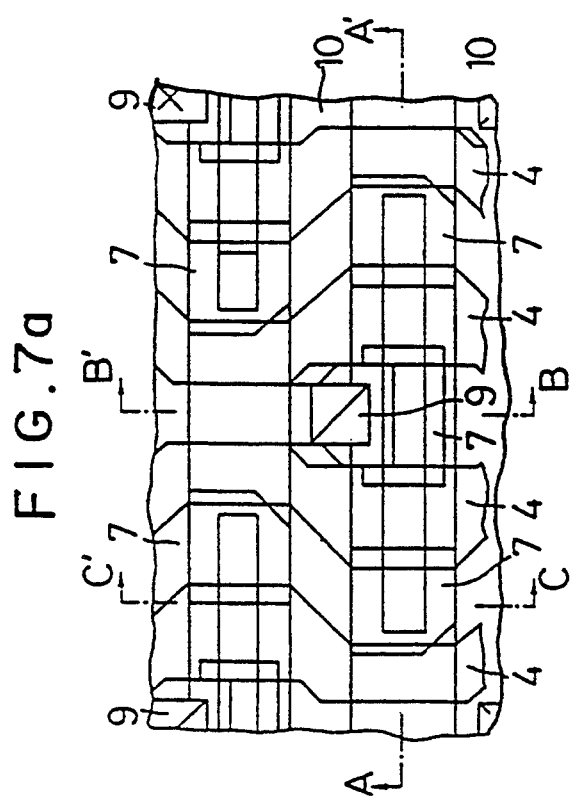
Figure 7D:
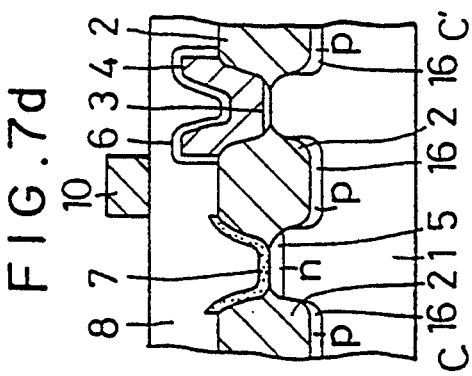
Figure 7C:
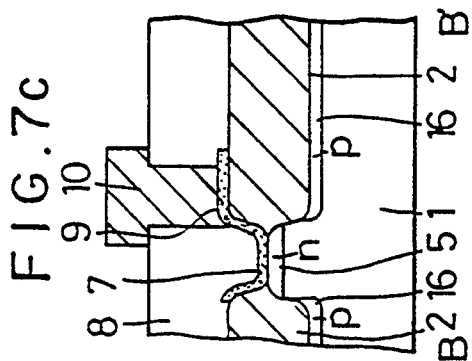
Figure 7B:
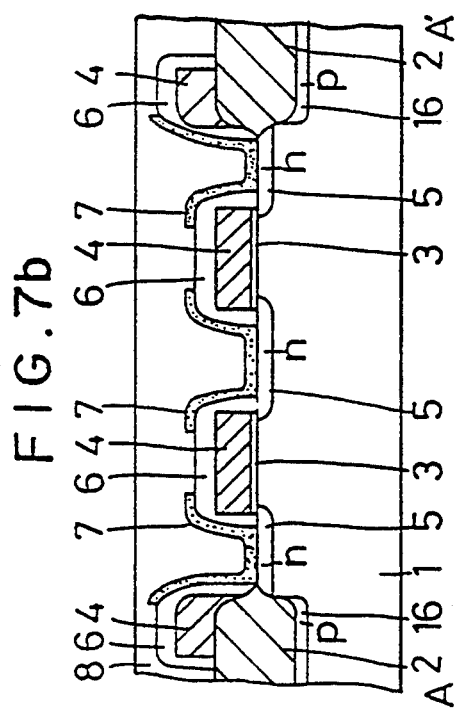
Figure 8A:
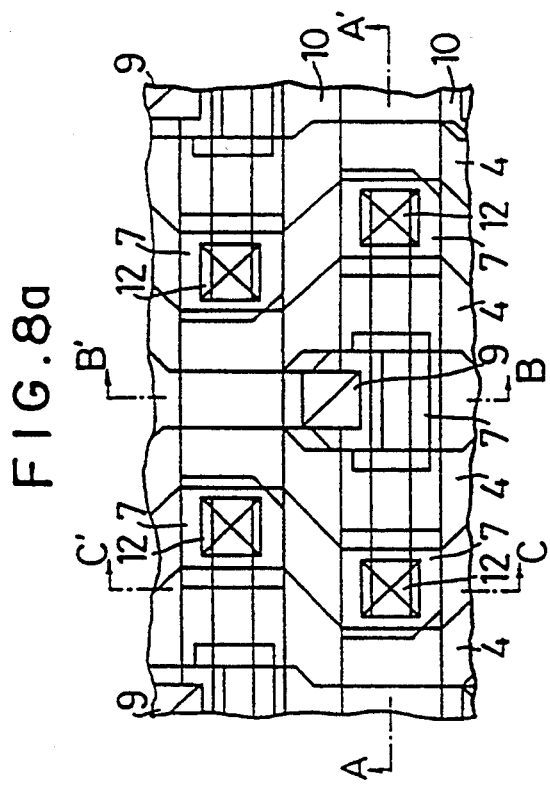
Figure 8D:
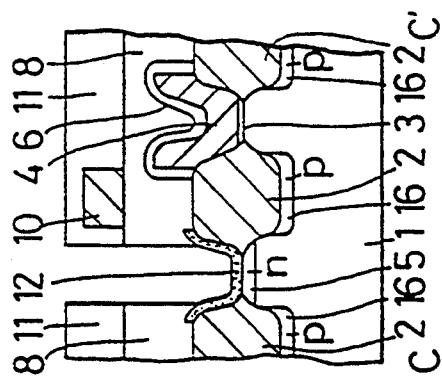
Figure 8C:
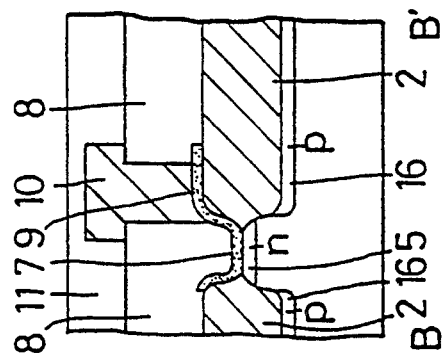
Figure 8B:
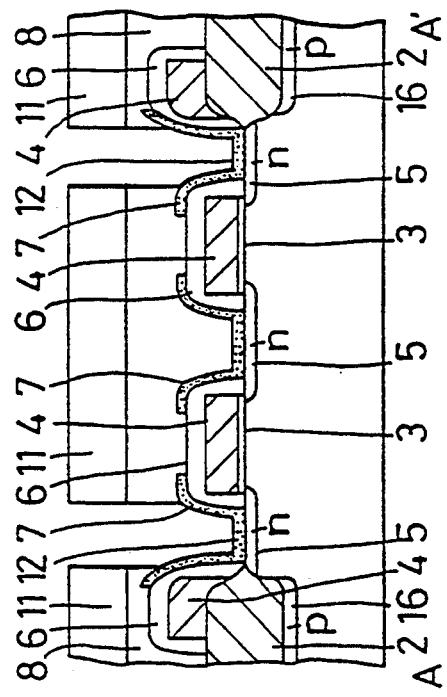
Figure 9A:
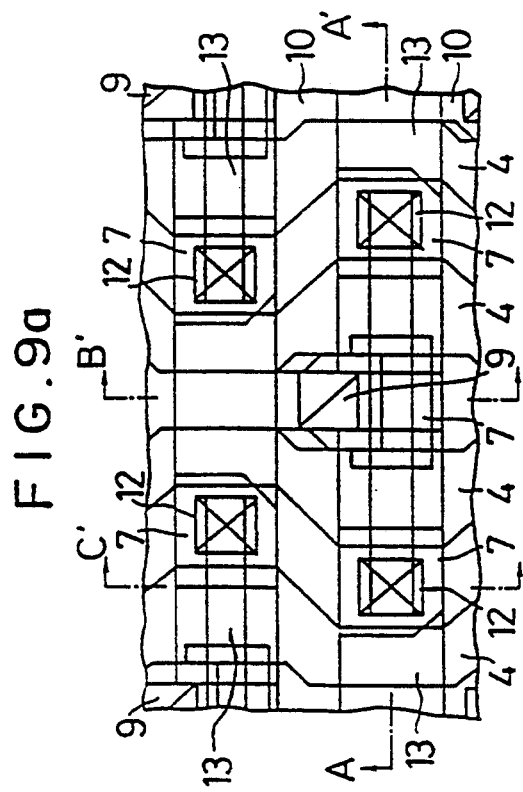
Figure 9D:
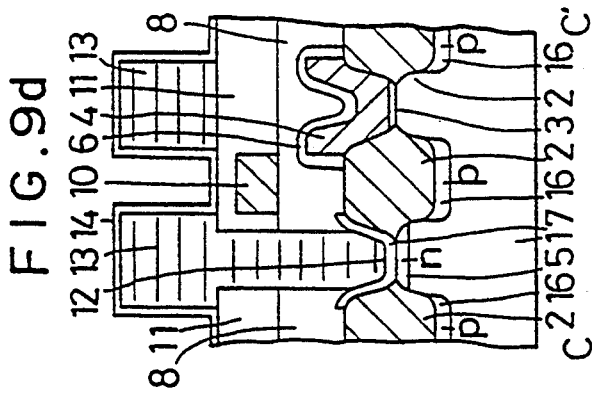
Figure 9C:
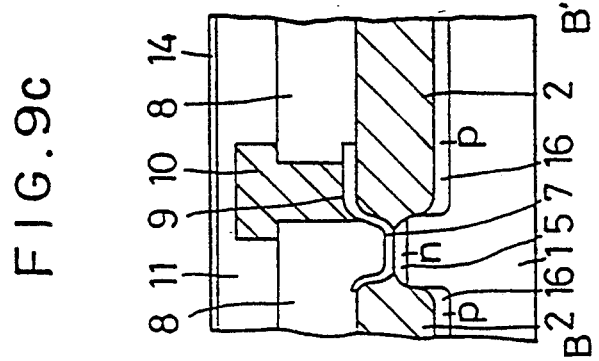
Figure 9B:
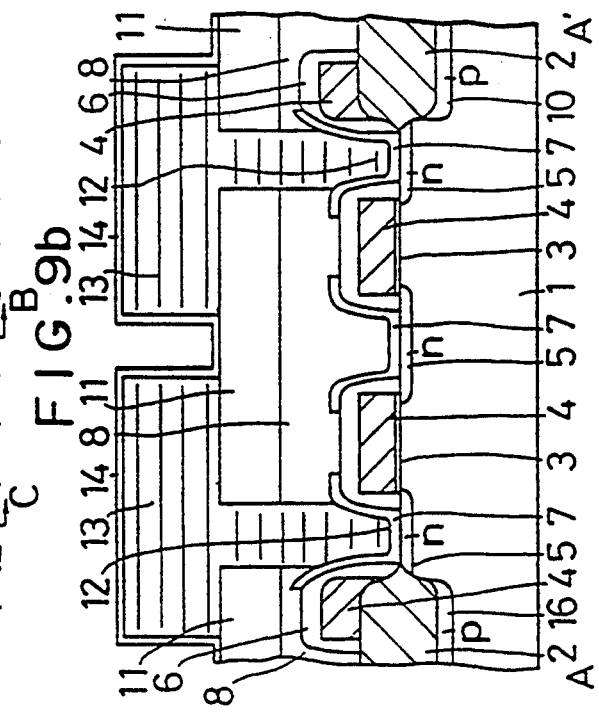

FIGS. 2a to 2d show a DRAM according to the first embodiment of the present invention, and particularly show cells of the DRAM for adjacent two bits along a bit line. In the figures, FIG. 2a is a plan view, FIG. 2b a sectional view taken along a line A—A' of the plan view, FIG. 2c a sectional view taken along a line B—B' of the plan view, and FIG. 2d a sectional view taken along a line C—C' of the plan view.

Respective memory cells are separated from each other by element separating insulation films 2 formed on a p type silicon substrate 1. In each memory cell, a gate insulation film 3 is formed on the substrate 1, and, on the gate insulation film 3, a gate electrode 4 is formed to form a MOS transistor. A bit line 10 is connected to a pad electrode 7 via a bit line contact 9. The pad electrode 7 is connected to an n-type diffusion layer 5. A storage node electrode 13 is located above the bit line 10 and on an interlayer insulation film 11. The storage node electrode 13 is connected to another pad electrode 7 via a storage node contact 12. Side faces of the storage node electrode 13 provide capacitance of the capacitor. The thickness of the storage node electrode 13 may be increased with no adverse influences on the processing of the bit line. On the storage node electrode 13, a capacitor insulation film 14 and a capacitor electrode 15 are formed. The capacitor electrode 15 exists above the bit line 10. Therefore, there is no need to make an opening through the capacitor electrode 15 to provide a contact for the bit line 10. Namely, within the memory cell, the capacitor electrode 15 is not processed.

FIGS. 3 to 9 show manufacturing processes, respectively, of the DRAM shown in FIGS. 2a to 2d. In FIGS. 3 to 9, a reference mark (a) represents a plan view (b) a sectional view taken along a line A—A' of the plan view, (c) a sectional view taken along a line B—B' of the plan view, and (d) a sectional view taken along a line C—C' of the plan view. Thick lines shown in the views (a) represent patterns to be added by corresponding processes.

In FIG. 3, a p-type silicon substrate 1 has a specific resistance of about 5 Ωcm. On the substrate 1, an oxide film 17 of 50 nm in thickness and a silicon nitride film 18 are formed and patterned. The patterned film 18 is used as a mask to implant boron in the substrate 1 to form a channel stopper impurity layer 16.

In FIG. 4, a selective oxidizing method is used to form a silicon oxide film of, for instance, 700 nm in thickness as an element separating insulation film 2. Due to oxidization, the channel stopper impurity layer 16 diffuses horizontally and under the element separating insulation film 2. The element separating insulation film 2 may be formed not only by the selective oxidizing method but also by other methods.

In FIG. 5, a gate insulation film 3 is formed in the thickness of about 10 nm by, for instance, thermal oxidization. Polycrystalline silicon is entirely deposited in the thickness of about 200 nm to form a gate electrode layer. A CVD method, for instance, is used to entirely deposit an interlayer insulation film 6 of about 200 nm in thickness. The gate electrode layer and interlayer insulation film 6 are patterned by reactive ion etching method to form gate electrodes 4. The gate electrodes 4 and interlayer insulation film 6 are used as masks to implant arsenic ions or phosphorus ions over the entire substrate 1, thereby forming an n-type diffusion layer 5.

The depth of the diffusion layer 5 is, for instance, about 150 nm. An interlayer insulation film 6' of about 100 nm in thickness is entirely deposited according to the CVD method, etc. The reactive ion etching method is used to etch the surface of the interlayer insulation film 6' so that the interlayer insulation film 6' may self-align and be left on the side faces of the gate electrodes 4.

In FIG. 6, polycrystalline silicon is entirely deposited in the thickness of about 50 nm. The deposited layer is doped by arsenic or phosphorus ion implantation or by phosphorus diffusion. The reactive ion etching technique is used to form pad electrodes 7.

In FIG. 7, an interlayer insulation film 8 of about 300 nm in thickness is entirely deposited. A bit line contact 9 is opened through the interlayer insulation film 8 according to the reactive ion etching method. The interlayer insulation film 8 may be obtained, for example, by depositing a CVD SiO2 film of 100 nm in thickness, a BPSG film of 350 nm in thickness and PSG film of 250 nm in thickness The PSG and BPSG films are melted at 900° C. Then, the PSG film and a surface layer of the BPSG film are etched with ammonium fluoride liquid to form the interlayer insulation film 8. After opening the bit line contact 9, polycrystalline silicon is deposited by for instance, CVD, and then molybdenum silicide is entirely deposited by spattering or by EB deposition. Layers thus formed are etched by reactive ion etching to pattern a bit line 10. Since steps formed on the substrate are not so large, the interlayer insulation film 8 is easily flatted, and the bit line 10 can be patterned with no trouble. Steps formed due to the interlayer insulation film 8 is relatively small so that the bit line may properly be laid.

In FIG. 8, an interlayer insulation film 11 of about 200 nm in thickness is entirely deposited. A storage node contact 12 is opened through the interlayer insulation film 11 by reactive ion etching. The interlayer insulation film 11 is formed by depositing a CVD SiO2 film of 50 nm in thickness, a BPSG layer of 300 nm in thickness and a PSG layer of 250 nm in thickness and by melting and etching these layers in a way similar to that of forming the interlayer insulation film 8.

In FIG. 9, polycrystalline silicon, for example, is entirely deposited in the thickness of 300 to 600 nm and doped by arsenic or phosphorus ion implantation or by phosphorus diffusion. The reactive ion etching method is used to form a storage node electrode 13. Then, a silicon nitride film is entirely deposited by CVD in the thickness of about 10 nm. Then the deposited film is oxidized in an atmosphere of water vapor at 950° C. for 30 minutes to form a capacitor insulation film 14. According to this embodiment, the capacitor insulation film 14 is a laminated structure of the silicon nitride film and silicon oxide film. However, the capacitor insulation film 14 may be formed with other materials which are usable as capacitor insulation films such as a single silicon oxide film and the laminated structure of a $Ta_2O_5$ film and a silicon nitride film.

Finally, as shown in FIG. 2, polycrystalline silicon is entirely deposited and then doped by arsenic or phosphorus ion implantation or by phosphorus diffusion to form a plate electrode 15, thus completing the basic structure of the cell. The plate electrode 15 is formal as a common electrode for an array of memory cells, and there is no need to form openings for bit line contacts.

According to this embodiment, a heat treatment process needed after the formation of the capacitor insulation film 14 is only the process of forming the plate electrode 15.

Although the embodiment has used polycrystalline silicon for forming the storage node electrode 23 and plate electrode 15, other materials such as tungsten (W) may be used for the same purposes.

FIGS. 10 to 13 show DRAMs according to the second to fifth embodiments of the present invention, respectively, Each figure shows cells of the DRAM corresponding to adjacent two bits along a bit line. In each figure, (a) is a plan view, (b) a sectional view taken along a line A—A' of the plan view, (c) a sectional view taken along a line B—B' of the plan view, and (d) a sectional view taken along a line C—C' of the plan view.

The second embodiment of the invention will be explained with reference to FIG. 10.

In the first embodiment of FIG. 2, the bit lines 10 have been disposed on the element separating insulation films 2. The element separating insulation films 2 have been arranged side by side in the direction of a word line (the gate electrode 4) and between memory cells. The bit lines 10 have been vertically spaced from the word lines to secure intervals between the bit lines 10, each bit line 10 has been connected to the pad electrode 7 which has been extended from the MOS diffusion layer opposite to the storage node contact 12 onto the element separating insulation film 2.

According to the second embodiment shown in FIG. 10, each bit line 10 is formed on each element region but not on an element separating region. To form a storage node contact 12, an opening is formed through the bit line 10 as shown in (d) of FIG. 10.

The third embodiment of the invention will be explained with reference to FIG. 11.

In the first embodiment of FIG. 2, the bit line 10 and storage node electrode 13 have been connected to the pad electrodes 7 which have been connected to the n-type diffusion layers 5, respectively. The main reason of this has been because the bit line 10 formed on the element separating insulation film 2 had to be connected to the n-type diffusion layer 5. This has increased the number of electrodes.

According to the third embodiment of FIG. 11, an n-type diffusion layer 5 as a contact for a bit line is elongated as indicated with thick lines to an element separating region. As a result, the pad electrode 7 of the first embodiment can be eliminated to connect the bit line to the n-type diffusion layer.

The fourth embodiment of the invention will be explained with reference to FIG. 12.

In the first embodiment of FIG. 2, the storage node electrode 13 has been in the shape of simple rectangular parallelepiped formed of rectangular flat faces surrounded with side faces.

According to the fourth embodiment of FIG. 12, a storage node electrode 13 is once formed in the shape of rectangular parallelepiped, and then a groove is formed in the middle of the storage node electrode 13 to extend along a word line (a gate electrode 4) and cross the storage node electrode 13. With this arrangement, the surface area of the storage node electrode 13 increases to increase capacitance of a capacitor. Above the storage node electrode 13, a plate electrode 15 is disposed. Although the fourth embodiment has formed the storage node electrode 13 in the grooved shape, the storage node electrode 13 may be processes in other shapes. For example, a recess may be formed at the center of the storage node electrode 13.

The fifth embodiment of the invention will be explained with reference to FIG. 13.

In the first embodiment of FIG. 2, the element separating insulation film 2 has been a field insulation film formed by selective oxidization. However, the element separating insulation film may be formed by other methods.

According to the fifth method of FIG. 13, a groove 19 is formed on a silicon substrate. Then, an element separating insulation film 2' formed by CVD method is embedded in the groove 19 to form a trench type element separation. The element separating insulation film 2' may be a silicon oxide film or a non-dope polycrystalline silicon film. Although the groove 19 is tapered in FIG. 13, the groove 19 may be straight.

Without departing from the spirit of the invention, various modifications may be made on the invention.

In the embodiments, the word lines (the gate electrodes 4) have been formed with polycrystalline silicon. To reduce resistance, an aluminum layer may be arranged on the plate electrode 15. The aluminum layer contacts with the word lines at predetermined intervals, for example, every 32 cells to shunt the resistance.

Although the interlayer insulation films 8 and 11 have been melted to flatten them, the films are flatly coated by bias spattering, etc. It is also possible to form the insulation films without flattening them.

In summary, according to the stacked capacitor cell structure of the present invention, bit lines are formed under storage node electrodes. Therefore, stepped portions existing at the time of processing the bit lines are only gate electrodes so that the bit lines may easily, be processed. Also, the bit lines are formed under a plate electrode. Therefore, the plate electrode may not be opened to form bit line contacts. Within memory cells, it is basically not necessary to process the plate electrode. Since the bit line contacts are formed before the formation of the storage node electrodes, the storage node electrodes can be extended onto the bit line contacts to improve capacitance of capacitors.

When a high dielectric film is employed to form a capacitor insulation film, the number of heat treatment processes to be carried out after the formation of the capacitor insulation film shall be small as possible. According to the structure of the present invention, a process to be carried out after the formation of the capacitor insulation film is only a process of forming a plate electrode. Therefore, a total number of heat treatment processes of the present invention is small. Thus, the present invention is advantageously applicable for the high dielectric films.

What is claimed is:

1. A method of manufacturing a semiconductor memory having memory cells, each composed of a transistor and a capacitor formed on a semiconductor substrate, the method comprising the steps of:
   forming a gate electrode on a gate insulation film in each memory cell region where said memory cells are to be formed on the semiconductor substrate;
   forming source and drain regions in the memory cell region by doping the semiconductor substrate with impurities, using the gate electrode as a mask;
   forming a bit line for the memory cell region and connecting the bit line to one of the source and drain regions;
   forming pad electrodes for the memory cell region, for connecting the bit line with one of the source and drain regions of the transistor and for connecting the electrode with the other of the source and drain regions of the transistor, wherein said pad electrode for connecting the bit line with one of the source and drain regions of the transistor is formed so as to be separated from the memory cell region;
   forming a first capacitor electrode for the memory cell region above the bit line and connecting the first capacitor electrode to the other of the source and drain regions which is not connected to the bit line; and
   forming a second capacitor electrode for the memory cell region on an insulation film formed on the first capacitor electrode.

2. The method as claimed in claim 1, wherein the bit line is disposed on an element separating region between memory cell regions, and the bit line extends orthogonally to a word line, which word line is composed of a gate electrode of the transistor.

3. The method as claimed in claim 1, wherein said transistor is a MOS transistor, and said capacitor is a MOS capacitor.

4. The method as claimed in claim 3, wherein one of source and drain regions of the MOS transistor contacts the bit line.

5. The method as claimed in claim 3, wherein the bit line is disposed on a memory cell region and orthogonally to a word line which is composed of a gate electrode of the MOS transistor.

6. The method as claimed in claim 1, wherein opposite surfaces of said first and second capacitor electrodes are formed unevenly in order to increase the interfacial area therebetween with the intervention of said insulation film.

7. The method as claimed in claim 6, wherein grooves are formed in said first and second capacitor electrodes.

8. The method as claimed in claim 1, further comprising the step of separating each adjacent memory cell by forming a groove therebetween and filling said groove with an insulating material.

9. The method as claimed in claim 8, wherein said insulating material is silicon oxide.

10. The method as claimed in claim 8, wherein said insulating material is a non-doped polycrystalline silicon.

* * * * *